United States Patent
Asayama (10) Patent No.: US 7,821,817 B2
(45) Date of Patent: Oct. 26, 2010

(54) SEMICONDUCTOR STORAGE DEVICE

(75) Inventor: Shinobu Asayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 85 days.

(21) Appl. No.: 12/238,690

(22) Filed: Sep. 26, 2008

(65) Prior Publication Data

US 2009/0086529 A1 Apr. 2, 2009

(30) Foreign Application Priority Data

Sep. 28, 2007 (JP) .............................. 2007-253882

(51) Int. Cl.
*G11C 7/00* (2006.01)
(52) U.S. Cl. ...................................... 365/156; 365/205
(58) Field of Classification Search .................. 365/156, 365/205

See application file for complete search history.

(56) References Cited

U.S. PATENT DOCUMENTS

2006/0039180 A1 * 2/2006 Kawasumi .................. 365/154
2007/0279965 A1 * 12/2007 Nakazato et al. ............ 365/154

FOREIGN PATENT DOCUMENTS

JP 2004-288306 A 10/2004
JP 2006-59520 A 3/2006

* cited by examiner

*Primary Examiner*—Michael T Tran
(74) *Attorney, Agent, or Firm*—Sughrue Mion, PLLC (57) ABSTRACT

In a semiconductor storage device including a transistor for reading port, undesired voltage decrease may occur in a bit line in a reading operation due to a leak current from the transistor for reading port of a memory cell, which may cause a reading error. A semiconductor storage device according to one aspect of the present invention includes a third transistor having one of a source and a drain connected to a first bit line and switching supply of a ground voltage performed on the first bit line in accordance with a value held in a memory cell according to selection and non-selection of the memory cell, and a fixed voltage keeping circuit keeping a potential of the other of the source and the drain of the third transistor to a fixed potential in a memory cell non-selected state in a six-transistor SRAM.

14 Claims, 11 Drawing Sheets

PRIOR ART

SEMICONDUCTOR STORAGE DEVICE

BACKGROUND OF THE INVENTION

1. Field of the Invention

The present invention relates to a semiconductor storage device.

2. Description of Related Art

An electronic device such as a computer typically includes a data storing means storing data. One of semiconductor storage devices employed as the data storing means includes an SRAM (Static Random Access Memory). The SRAM has the advantage of high-speed operation that there is no need to perform a refresh operation and that the memory cell access time is short and so on.

However, transistors forming the SRAM cell have been miniaturized in recent years and the current driving ability of the transistor has been decreasing, which interrupts the high-speed operation. In order to facilitate the data reading operation of the memory cell, there has been proposed an SRAM driving bit lines by a read-only transistor having high driving ability. One example of the SRAM including the read-only transistor is disclosed in Japanese Unexamined Patent Application Publication No. 2006-59520.

Figure 9:
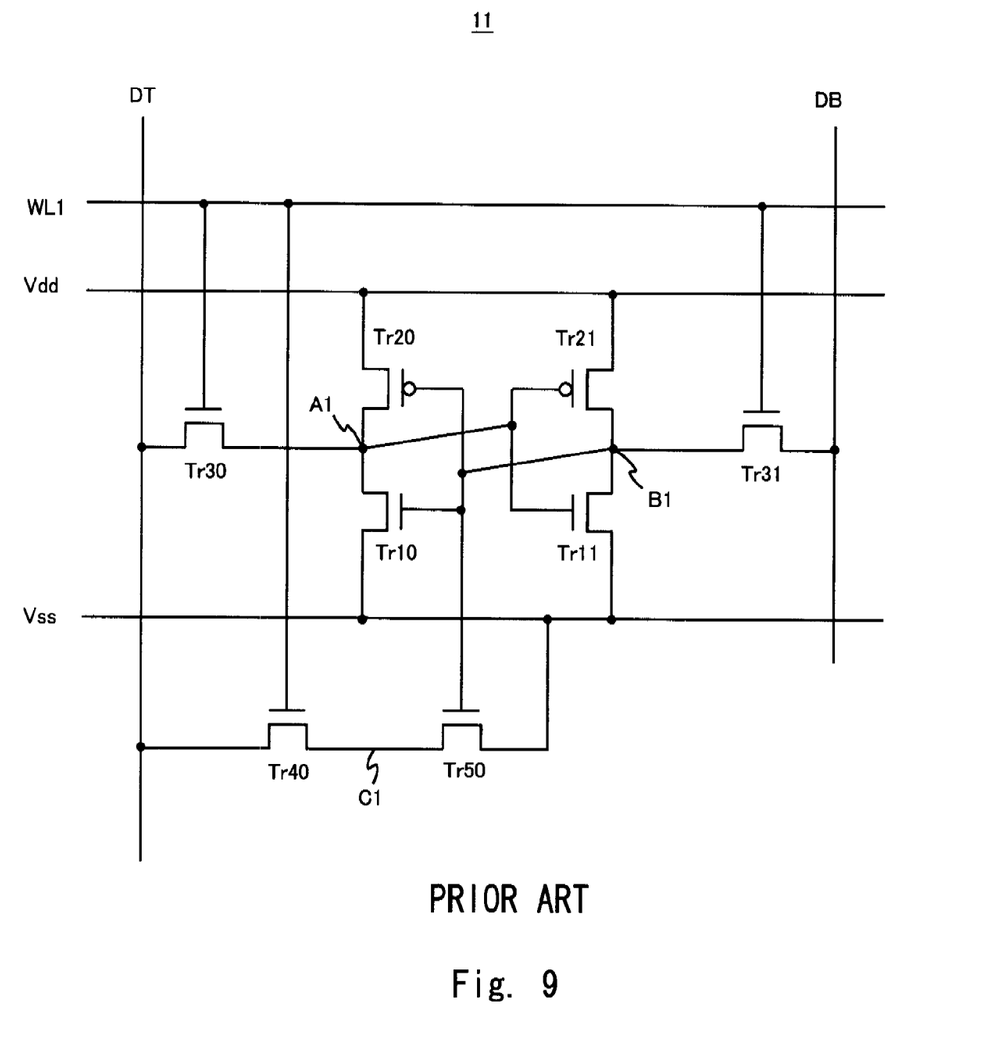
FIG. 9 shows one example of a circuit configuration of a memory cell of a semiconductor storage device according to a prior art.

FIG. 9 shows a circuit diagram of an SRAM cell 11 disclosed in Japanese Unexamined Patent Application Publication No. 2006-59520. As shown in FIG. 9, the SRAM cell 11 includes an inverter having an nMOS transistor Tr10 and a pMOS transistor Tr20 and an inverter having an nMOS transistor Tr11 and a pMOS transistor Tr21 so as to form a latch circuit. Further, inputs and outputs of each inverter are connected at a node A1 and a node B1. An nMOS transistor Tr30 is connected between the node A1 and a bit line DT. A gate of the nMOS transistor Tr30 is connected to a word line WL1. An nMOS transistor Tr31 is connected between the node B1 and a bit line DB. A gate of the nMOS transistor Tr31 is connected to the word line WL1.

Figure 10:
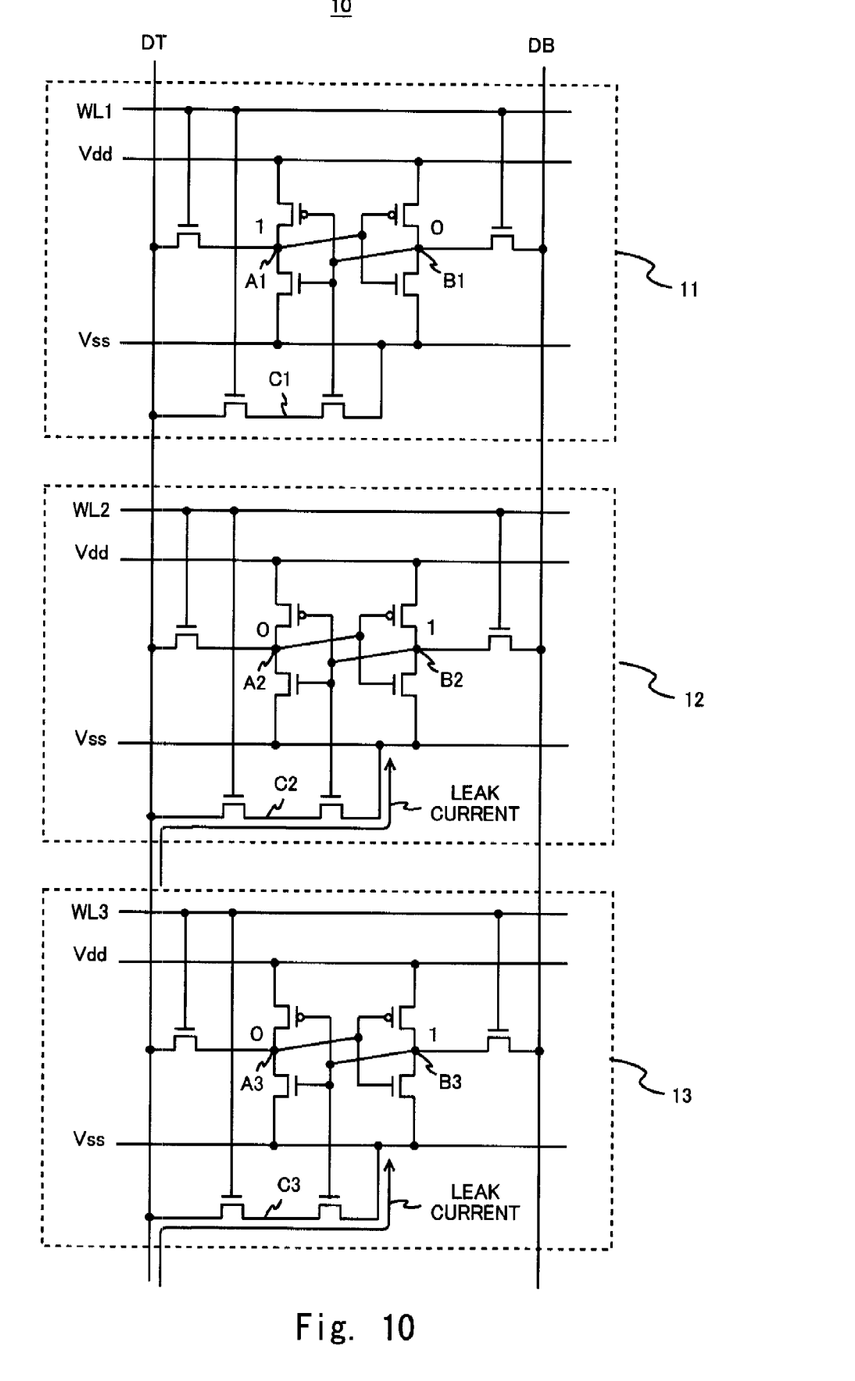
FIG. 10 shows one example of an SRAM circuit of the semiconductor storage device according to the prior art.

Further, an nMOS transistor Tr40 is connected between the bit line DT and a node C1. A gate of the nMOS transistor Tr40 is connected to the word line WL1. An nMOS transistor Tr50 is connected between the node C1 and a ground terminal (Vss). A gate of the nMOS transistor Tr50 is connected to the node B1. Note that the bit line DT functions both as a reading port and as a writing port. As shown in FIG. 10, the SRAM circuit 10 has a configuration in which a plurality of memory cells having a similar configuration as that of the SRAM cell 11 are connected to one bit line pair.

When low-level data is stored in the node A1 and high-level data is stored in the node B1, the SRAM cell 11 sets the bit line DT to the low level and sets the bit line DB to the high level in reading the data. In a precharge period before the data reading is started, both of the bit lines DT and DB are set to the high level. When the data is read out from the SRAM cell 11 with such a condition, the SRAM cell 11 is able to draw current rapidly from the bit line DT by the nMOS transistor Tr40. Accordingly, the SRAM cell 11 realizes the high-speed operation while operating with low power supply voltage. Note that the current driving ability of the nMOS transistor Tr40 is set high in order to realize the high-speed operation.

Figure 11:
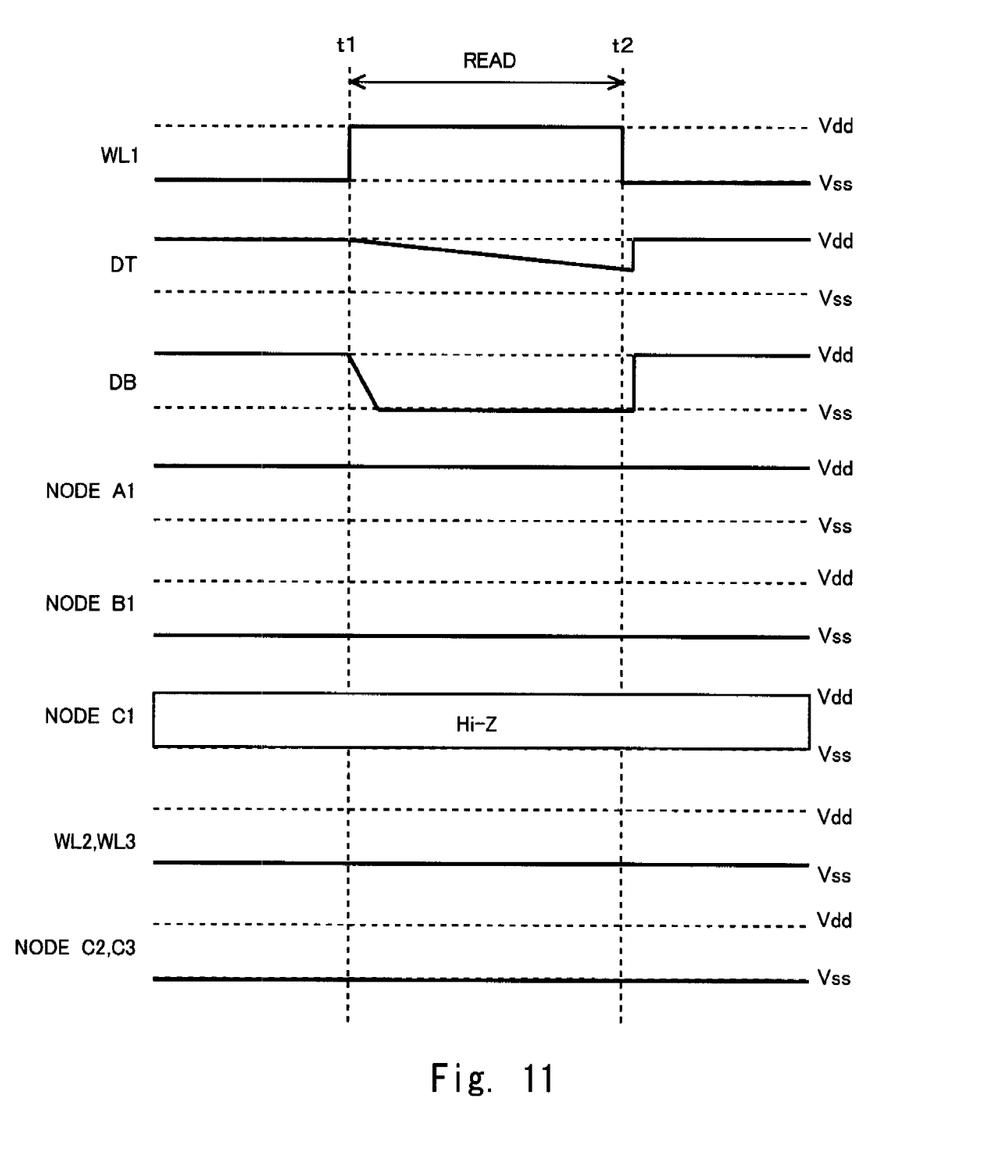
FIG. 11 shows one example of a timing chart of the semiconductor storage device according to the prior art.

However, the nMOS transistor Tr40 has a large channel leak current as well. Therefore, there is caused a potential fluctuation of the bit lines due to the channel leak current, which causes data reading failure in the SRAM cell 11. FIG. 11 shows a timing chart showing the operation of the SRAM circuit 10 shown in FIG. 10 for the purpose of describing the problem.

As shown in FIG. 11, the SRAM circuit 10 reads out data during a reading period (Read period in FIG. 11) at the timing t1 to t2. In the example shown in FIG. 11, the word line WL1 is in the high level, and the word lines WL2 and WL3 are in the low level in the reading period. Therefore, the SRAM cell 11 is in a selection state and the SRAM cells 12 and 13 are in a non-selection state. The data is read out from the SRAM cell 11 so that the bit line DT keeps the high level and the bit line DB is in the low level.

At this time, since the word lines WL2 and WL3 are in the low level in the SRAM cells 12 and 13, the nMOS transistor Tr40 is in a disconnection state. On the other hand, the nMOS transistor Tr50 is in a conduction state in accordance with the data stored in the SRAM cells 12 and 13. Accordingly, the nodes C2 and C3 have a ground potential. In summary, a potential difference in accordance with the power supply potential is generated between a source and a drain of the nMOS transistor Tr40 of the SRAM cells 12 and 13.

The nMOS transistor Tr40 used for reading the data has a high current driving ability and a large channel leak current. Therefore, when there is generated a potential difference between the source and the drain of the nMOS transistor Tr40, the leak current flows between the source and the drain of the nMOS transistor Tr40. This leak current flows from the bit line DT in the high impedance state keeping the high level to the ground terminal Vss. Accordingly, the charge is drawn out from the bit line DT due to this leak current, which decreases the potential level of the bit line DT.

In recent years, an operation power supply voltage of the semiconductor storage device has been reduced, and the potential difference between the high level and the low level in the bit line has also been reduced. Therefore, when the potential of the high level reduces in the bit line, a sense amplifier may falsely detect the potential difference of the bit line pair, which causes the data reading failure. Further, since the channel leak current tends to be increased in a high temperature environment, this problem is more significant in the high temperature environment.

Further, Japanese Unexamined Patent Application Publication No. 2004-288306 discloses a technique including a memory cell storing data, a reference cell generating a leak current, and a correction circuit correcting a signal of a bit line in accordance with the leak current from the reference cell. However, since the reference cell and the correction circuit and the like need to be added in this technique, the circuit size is increased.

As stated above, in a semiconductor storage device including a transistor for reading port facilitating a reading operation in a bit line, undesired voltage decrease may occur in the bit line in the reading operation due to the leak current from the transistor facilitating the reading operation, which may cause a reading error.

SUMMARY

A semiconductor storage device according to one aspect of the present invention includes a plurality of memory cells, each of the plurality of memory cells including a first inverter and a second inverter, a first node and a second node, the first node being connected to an output of the first inverter and an input of the second inverter, the second node being connected to an output of the second inverter and an input of the first inverter, a first transistor and a second transistor, the first transistor having one of a source and a drain connected to the first node, the second transistor having one of a source and a drain connected to the second node, a first bit line and a second bit line, the first bit line being connected to the other of the source and the drain of the first transistor, the second bit line being connected to the other of the source and the drain of the second transistor, and a word line connected to a gate of the first transistor and a gate of the second transistor, the semiconductor storage device including a third transistor having one of a source and a drain connected to the first bit line and switching supply of a ground voltage performed on the first bit line in accordance with a value held in the memory cell according to selection and non-selection of the memory cell, and a fixed voltage keeping circuit keeping a potential of the other of the source and the drain of the third transistor to a fixed potential in a memory cell non-selected state.

A semiconductor storage device according to another aspect of the present invention includes a plurality of memory cells, each of the plurality of memory cells including a first inverter and a second inverter, a first node and a second node, the first node being connected to an output of the first inverter and an input of the second inverter, the second node being connected to an output of the second inverter and an input of the first inverter, a first transistor and a second transistor, the first transistor having one of a source and a drain connected to the first node, the second transistor having one of a source and a drain connected to the second node, a first bit line and a second bit line, the first bit line being connected to the other of the source and the drain of the first transistor, the second bit line being connected to the other of the source and the drain of the second transistor, and a word line connected to a gate of the first transistor and a gate of the second transistor, the semiconductor storage device including a third transistor having one of a source and a drain connected to a third bit line and switching supply of a ground voltage performed on the third bit line in accordance with a value held in the memory cell according to selection and non-selection of the memory cell, and a fixed voltage keeping circuit keeping a potential of the other of the source and the drain of the third transistor to a fixed potential in a memory cell non-selected state.

According to the semiconductor storage device of the present invention, the other potential of the source or the drain of the third transistor is fixed to a fixed potential in the memory cell non-selected state. Accordingly, it is possible to prevent the potential of the other terminal of the source or the drain of the third transistor from being made lower than the potential of the first bit line regardless of data stored in the first bit line and the memory cell. In summary, it is possible to prevent the leak current between the source and the drain of the third transistor.

According to the semiconductor storage device of the present invention, it is possible to prevent the reading error.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The specific embodiment to which the present invention is applied will now be described in detail with reference to the drawings. This embodiment is the one in which the present invention is applied to an SRAM.

Figure 1:
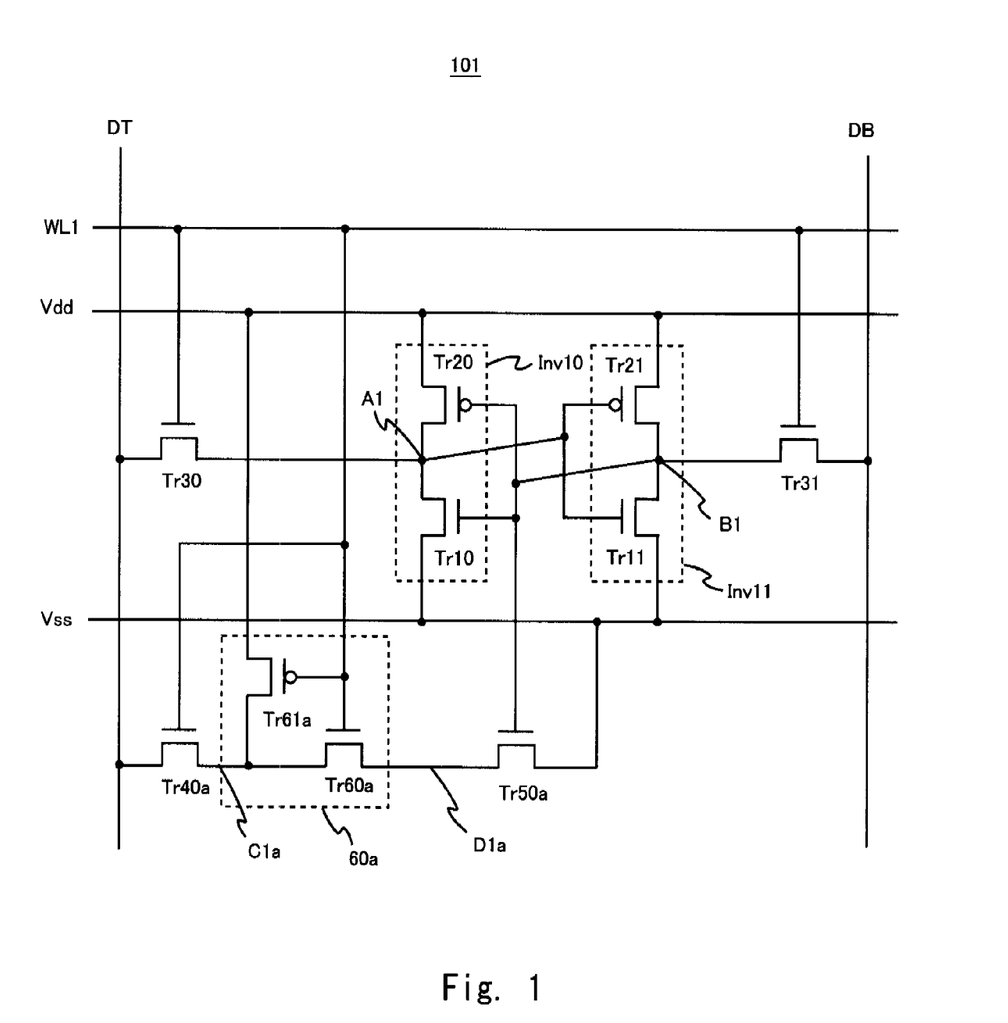
FIG. 1 shows one example of a circuit configuration of a memory cell of a semiconductor storage device according to a first embodiment.

FIG. 1 shows one example of a circuit configuration of a memory cell of a semiconductor storage device of the present embodiment. As shown in FIG. 1, a memory cell 101 includes a bit line pair including a bit line DT (first bit line) and a bit line DB (second bit line), an inverter Inv10 (first inverter), an inverter Inv11 (second inverter), an nMOS transistor Tr30 (first transistor), and an nMOS transistor Tr31 (second transistor).

An output of the inverter Inv10 is connected to a node A1 (first node) and an input of the inverter Inv10 is connected to a node B1 (second node). The inverter Inv10 includes an nMOS transistor Tr10 and a pMOS transistor Tr20. The transistor Tr10 has a drain connected to the node A1, a source connected to a ground terminal Vss (ground voltage), and a gate connected to the node B1. The transistor Tr20 has a source connected to a power supply voltage terminal Vdd (output voltage Vdd) outputting a power supply voltage, a drain connected to the node A1, and a gate connected to the node B1.

An input of the inverter Inv11 is connected to the node A1 and an output of the inverter Inv11 is connected to the node B1. The inverter Inv11 includes an nMOS transistor Tr11 and a pMOS transistor Tr21. The transistor Tr11 has a drain connected to the node B1, a source connected to a ground terminal Vss, and a gate connected to the node A1. The transistor Tr21 has a source connected to the power supply voltage terminal Vdd, a drain connected to the node B1, and a gate connected to the node A1.

The transistor Tr30 is connected between the bit line DT and the node A1, and has a gate connected to a word line WL1. The transistor Tr31 is connected between the bit line DB and the node B1, and has a gate connected to the word line WL1.

The memory cell 101 includes an nMOS transistor Tr40a (third transistor), an nMOS transistor Tr50a (fourth transistor), and a fixed voltage keeping circuit 60a. The transistor Tr40a has one of a source and a drain connected to the bit line DT, the other of the source and the drain connected to a node C1a, and a gate connected to the word line WL1. The transistor Tr50a has one of the source and the drain connected to the ground terminal Vss, the other of the source and the drain connected to a node D1a, and a gate connected to the node B1.

The fixed voltage keeping circuit 60a includes an nMOS transistor Tr60a (sixth transistor) and a pMOS transistor Tr61a (fifth transistor). The transistor Tr61a has a source connected to a power supply voltage terminal Vdd, a drain connected to the node C1a, and a gate connected to the word line WL1. The transistor Tr60a has one of a source and a drain connected to the node C1a, the other of the source and the drain connected to the node D1a, and a gate connected to the word line WL1. The fixed voltage keeping circuit 60a fixes the node C1a to a high level, or voltage Vdd, as the fixed potential in the memory cell non-selected state, which means when a word select signal of the word line WL1 is in a low level. Accordingly, in the present embodiment, the power supply voltage terminal Vdd is set to the fixed potential node.

Further, the fixed voltage keeping circuit 60a may have a different configuration within a range not influencing the basic performance. For example, it is possible to have a configuration in which each of the gates of the transistors Tr60a and Tr61a is connected to independent signal lines and the signal lines control the ON and OFF of the transistors Tr60a and Tr61a. Although the fixed potential is set to the power supply voltage (voltage Vdd) in the present embodiment, it is also possible to set the fixed potential to the voltage Vdd/2 if the precharge voltage when the bit lines DT and DB are precharged is Vdd/2. In summary, the fixed potential has the same potential to the precharge voltage when the bit lines are precharged.

Figure 2:
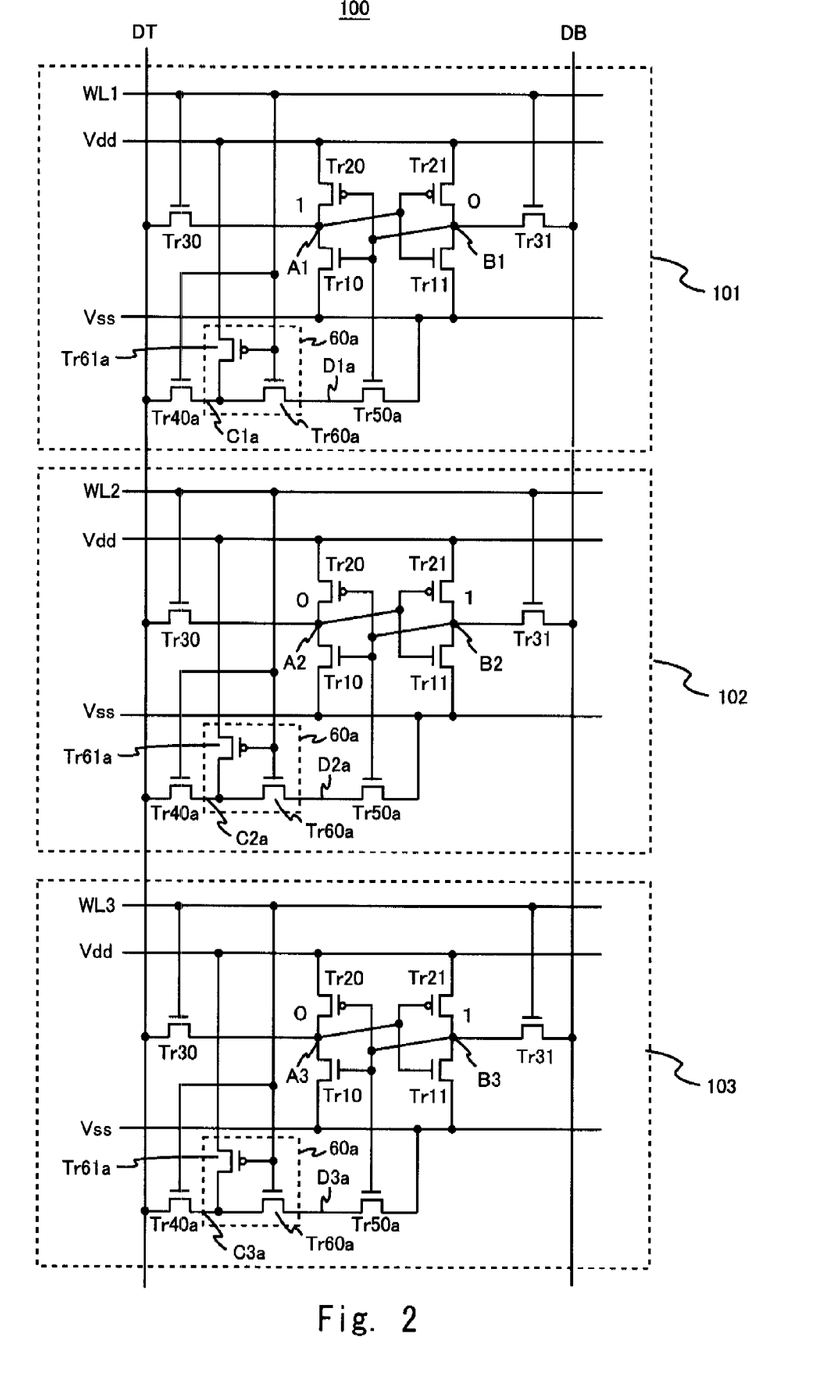
FIG. 2 shows one example of an SRAM circuit of the semiconductor storage device according to the first embodiment.

FIG. 2 shows one example of an SRAM circuit 100. The SRAM circuit 100 includes memory cells 102 and 103 having the same circuit configuration as that of the memory cell 101 of FIG. 1 and connected between the bit line pair formed by the bit lines DT and DB. Note that nodes A2 and A3 in the memory cells 102 and 103 correspond to the node A1 of the memory cell 101. Nodes B2 and B3 in the memory cells 102 and 103 correspond to the node B1 of the memory cell 101. Nodes C2a and C3a in the memory cells 102 and 103 correspond to the node C1a of the memory cell 101. Nodes D2a and D3a in the memory cells 102 and 103 correspond to the node D1a in the memory cell 101. Word lines WL2 and WL3 in the memory cells 102 and 103 correspond to the word line WL1 of the memory cell 101.

In the present embodiment, the memory cells are arranged in three lines in a row direction and one line in a column direction for the sake of simplicity. However, it is also possible to increase the number of memory cells in the column direction and the row direction so that the memory cells are arranged in matrix form. In this case, the number of word lines connected to the plurality of memory cells in each row unit and the number of bit line pairs connected in each column unit are needed to be increased in accordance with the number of memory cells.

Figure 3:
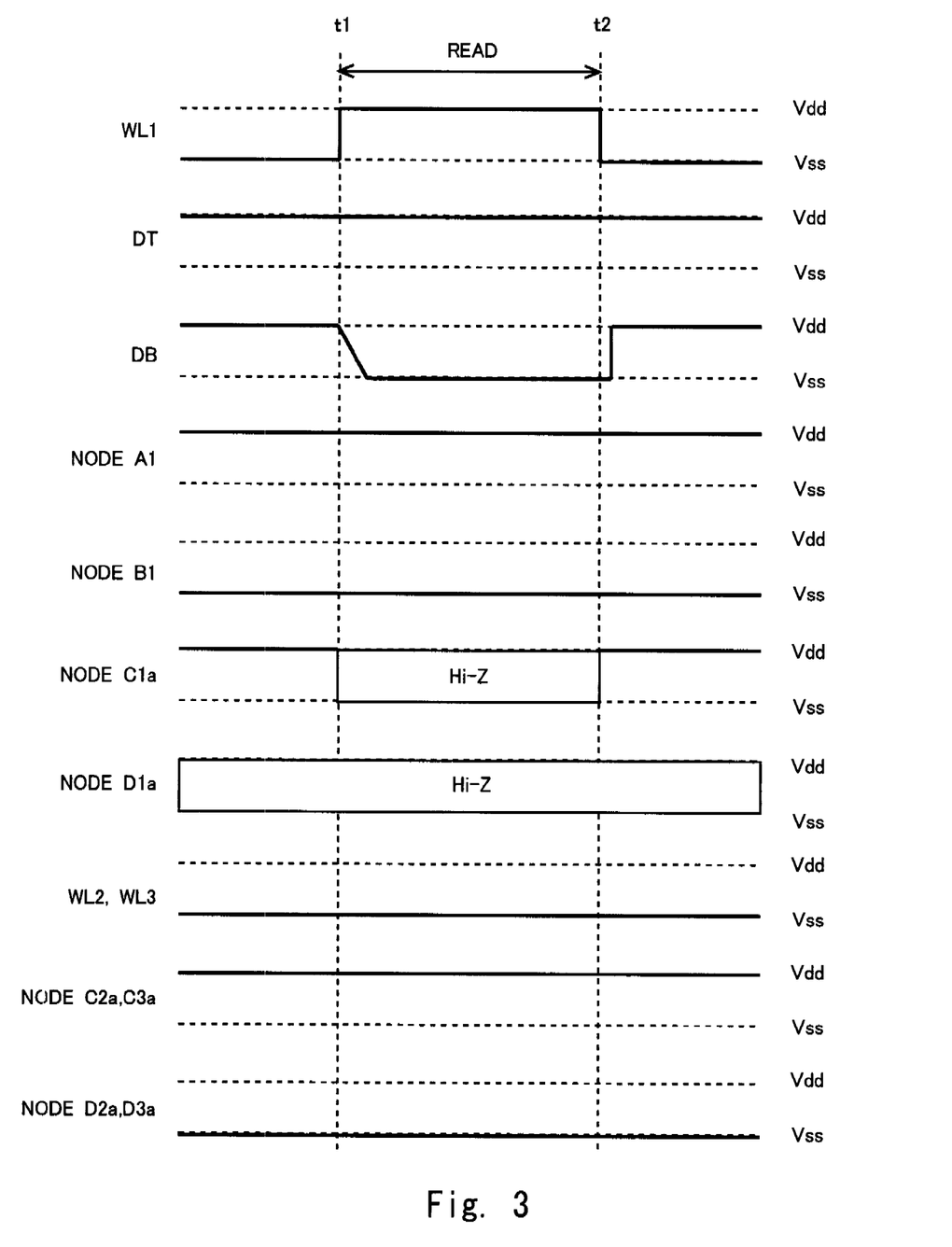
FIG. 3 shows one example of a timing chart of the semiconductor storage device according to the first embodiment.

The operation of the above circuit will be described with reference to a timing chart shown in FIG. 3. In this example, data held in the memory cell 101 is "1", which means that the potential of the node A1 is in the high level ("1" in FIG. 2) and the potential of the node B1 is in the low level ("0" in FIG. 2) as shown in FIG. 2. Further, the data held in the memory cells 102 and 103 are "0", which means that the potential of the nodes A2 and A3 are in the low level ("0" in FIG. 2) and the potential of the nodes B2 and B3 are in the high level ("1" in FIG. 2). We now assume a case in which the data held in the memory cell 101 is read out.

Before the time t1, word select signals of the word lines WL1, WL2, and WL3 are in the low level, and the transistors Tr30, Tr31, and Tr40a of the memory cells 101, 102, and 103 are in the OFF state. The bit lines DT and DB are precharged to the high level by a precharge circuit (not shown). Further, since the data held in the memory cell 101 is "1", the node A1 is in the high level and the node B1 is in the low level. The potential of the node C1a is in the high level since the transistor Tr61a is in the ON state and the transistor Tr60a is in the OFF state. The node D1a is in the high impedance state since the transistor Tr50a is in the OFF state.

Since the data held in the memory cells 102 and 103 are "0", the nodes A2 and A3 are in the low level and the nodes B2 and B3 are in the high level. Further, the potential of the nodes C2a and C3a are in the high level since the transistor Tr61a is in the ON state and the transistor Tr60a is in the OFF state. The nodes D2a and D3a are connected to the ground terminal Vss and are in the low level since the transistor Tr50a is in the ON state.

At the time t1 to t2, which is the reading period, the word select signal of the word line WL1 is raised to the high level, so that the transistors Tr30, Tr31, Tr40a, and Tr60 of the memory cell 101 are in the ON state and the transistor Tr61 is in the OFF state. Therefore, the bit line DT and the node A1, and the bit line DB and the node B1 are connected, and the data held in the memory cell 101 is output to the bit lines DT and DB. At the same time, the precharge circuit precharging the bit lines DT and DB stops the operation Accordingly, the potential of the bit line DB decreases from the high level to the low level. The memory cells 102 and 103 which are non-selected memory cells keep the state before the time t1. The nodes C2a and C3a keep the high level.

After the time t2, the word select signal of the word line WL1 is fallen and the transistors Tr30, Tr31, and Tr40a of the memory cell 101 are in the OFF state. The bit lines DT and DB are precharged to the high level by the precharge circuit. The state is the same as that before the time t1.

According to the prior art, in the reading period of the data held in the memory cell 101 at the time t1 to t2, the potential of the bit line DT keeping the high level in the high impedance state has decreased by the leak current of the transistor Tr40a of the non-selected memory cells 102 and 103. This causes the unwanted voltage decrease in the sense amplifier, which generates output error when the output expected value from the bit line DT is in the high level.

On the other hand, according to the embodiment of the present invention, the nodes C2a and C3a between the transistor Tr40a and the fixed voltage keeping circuit 60a are kept to the high level when the memory cells 102 and 103 are in the non-selected state, whereby there is no potential difference between the source and the drain of the transistor Tr40a and the leak current can be prevented. Accordingly, there is caused no voltage decrease of the bit line DT keeping the high level in the high impedance state due to the leak current of the transistor Tr40a which is the problem in the prior art. Therefore, there is generated no undesired voltage decrease in the sense amplifier, which makes it possible to prevent the output error from being produced when the output expected value from the bit line DT is in the high level. Further, since there is generated no leak current as stated above, there is no influence due to the leak current which exponentially increases by the temperature increase which is the problem in the prior art.

Now, a description will be made on a case where the memory cell 101 holds "0" data, which means the potential of the node A1 is in the low level and the potential of the node B1 is in the high level, and the data is read out to the bit line DT. In this case, the low-level potential of the node A1 is transmitted to the bit line DT in the reading period, and the potential of the bit line DT decreases as well. As described above, the transistor Tr40*a* has a large leak current; therefore the leak current flows from the high-level nodes A2 and A3 of the non-selected memory cell to the bit line DT, which may raise the potential of the bit line and generate the output error. However, the voltage decrease of the bit line DT sensed by the sense amplifier for setting the output value from the bit line DT to "0" (low level) needs not be so large. For example, in the present embodiment, the voltage remains at least approximately Vdd/2. Therefore, the potential difference between the source and the drain of the transistor Tr40*a* of the non-selected memory cell is not so large, and there is flowed little leak current. Accordingly, the leak current by the transistor Tr40*a* in this case causes no problem.

Figure 4:
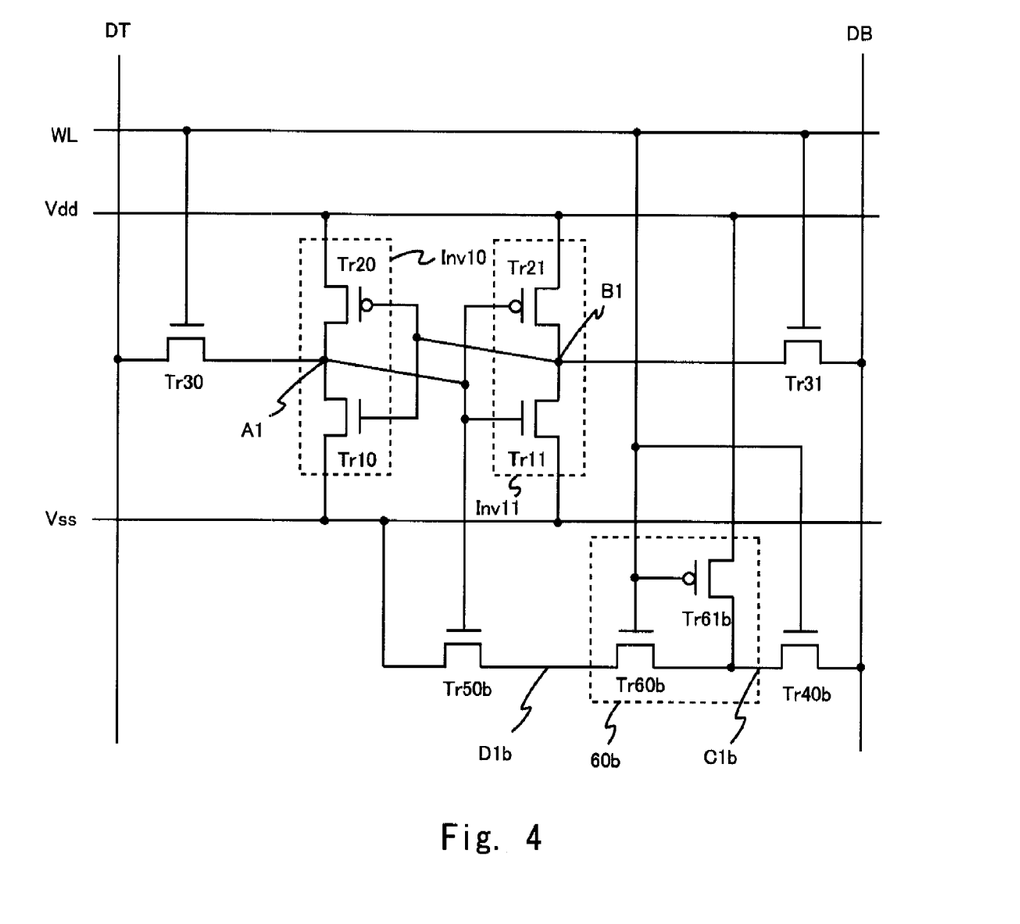
FIG. 4 shows another example of a circuit configuration of the memory cell of the semiconductor storage device according to the first embodiment.

Note that the present invention is not limited to the above embodiment but can be changed as appropriate without departing from the spirit of the present invention. For example, as shown in FIG. 4, a read-only current path formed by the similar configuration as that of the transistors Tr40*a*, Tr50*a*, and the fixed voltage keeping circuit 60*a* connected to the bit line DT in FIG. 1 may be connected to the bit line DB side. The current path is configured by transistors Tr40*b*, Tr50*b*, and a fixed voltage keeping circuit 60*b*. A node between the transistors Tr40*b* and Tr60*b* is set to C1*b*, and a node between the transistors Tr60*b* and Tr50*b* is set to D1*b*. Therefore, the transistor Tr40*b* has one of a source and a drain connected to the bit line DB, the other of the source and the drain connected to the node C1*b*, and a gate connected to the word line WL. The transistor Tr50*b* has one of a source and a drain connected to the ground terminal Vss, the other of the source and the drain connected to the node D1*b*, and a gate connected to the node A1. A source of an nMOS transistor Tr61*b* of the fixed voltage keeping circuit 60*b* is connected to the power supply voltage terminal Vdd, a drain thereof is connected to the node C1*b*, and a gate thereof is connected to the word line WL. One of a source and a drain of the fixed voltage keeping circuit 60*b* is connected to the node C1*b*, the other of the source and the drain is connected to the node D1*b*, and the gate is connected to the word line WL.

Figure 5:
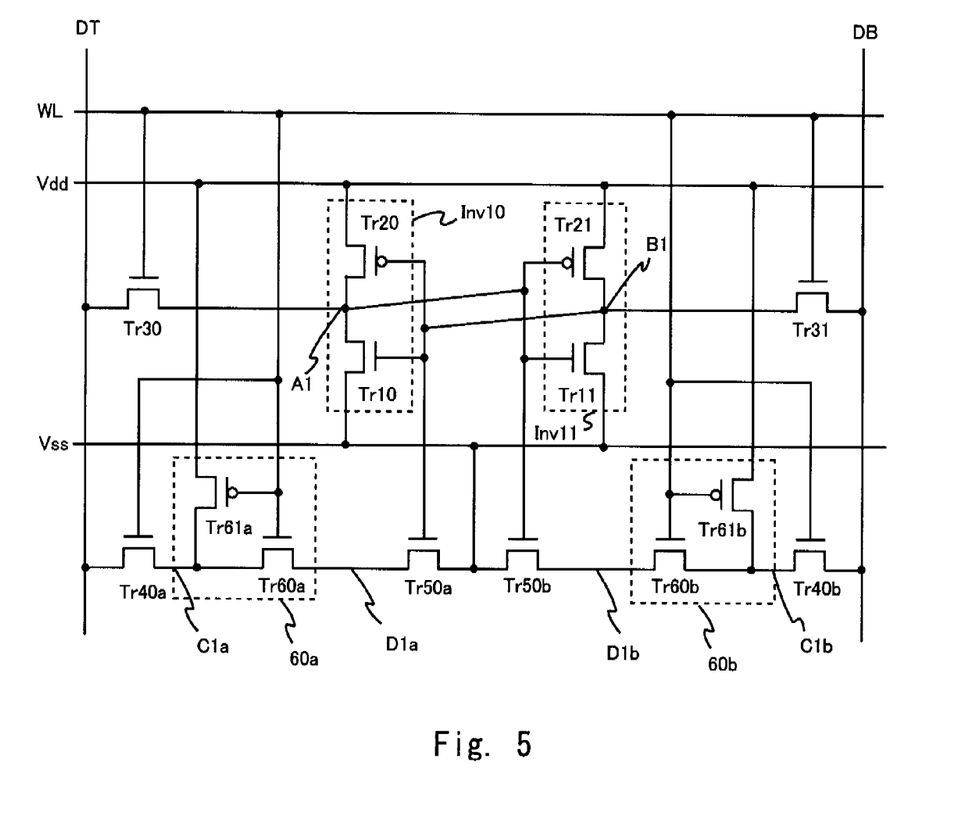
FIG. 5 shows another example of a circuit configuration of the memory cell of the semiconductor storage device according to the first embodiment.

Further, as shown in FIG. 5, the memory cell may be configured by connecting the bit lines and two read-only current paths using the connection configuration of FIGS. 1 and 4. In FIG. 5, the transistors Tr40*a*, Tr50*a*, and the fixed voltage keeping circuit 60*a* are connected to the bit line DT, and the transistors Tr40*b*, Tr50*b*, and the fixed voltage keeping circuit 60*b* are connected to the bit line DB.

Figure 6:
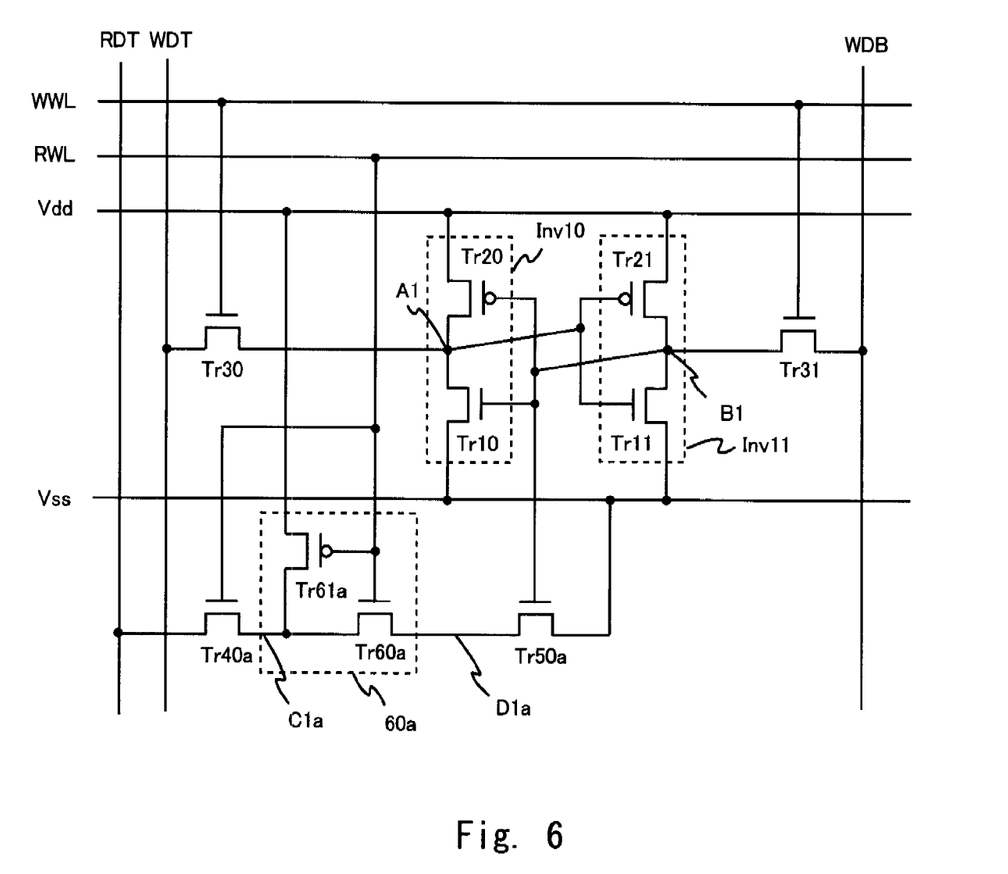
FIG. 6 shows one example of a circuit configuration of a memory cell of a semiconductor storage device according to another embodiment.

Further, as shown in FIG. 6, two word lines of a write-only word line WWL and a read-only word line RWL may be employed for transmitting the word select signals. In this case, the gates of the transistors Tr30 and Tr31 are connected to the write-only word line WWL. The gates of the transistors Tr60*a* and Tr61*a* included in the fixed voltage keeping circuit 60*a* and the gate of the transistor Tr40*a* are connected to the read-only word line RWL. Further, two bit lines of a write-only bit line WDT and a read-only bit line RDT may be employed for outputting the held data by the memory cell. In this case, one of the source and the drain of the transistor Tr30 is connected to the write-only bit line WDT. One of the source and the drain of the transistor Tr40*a* is connected to the read-only bit line RDT. Other connection relations are the same as those shown in FIG. 1. FIG. 6 shows two-port memory cell including the word lines and the bit lines for reading port and writing port.

Figure 7:
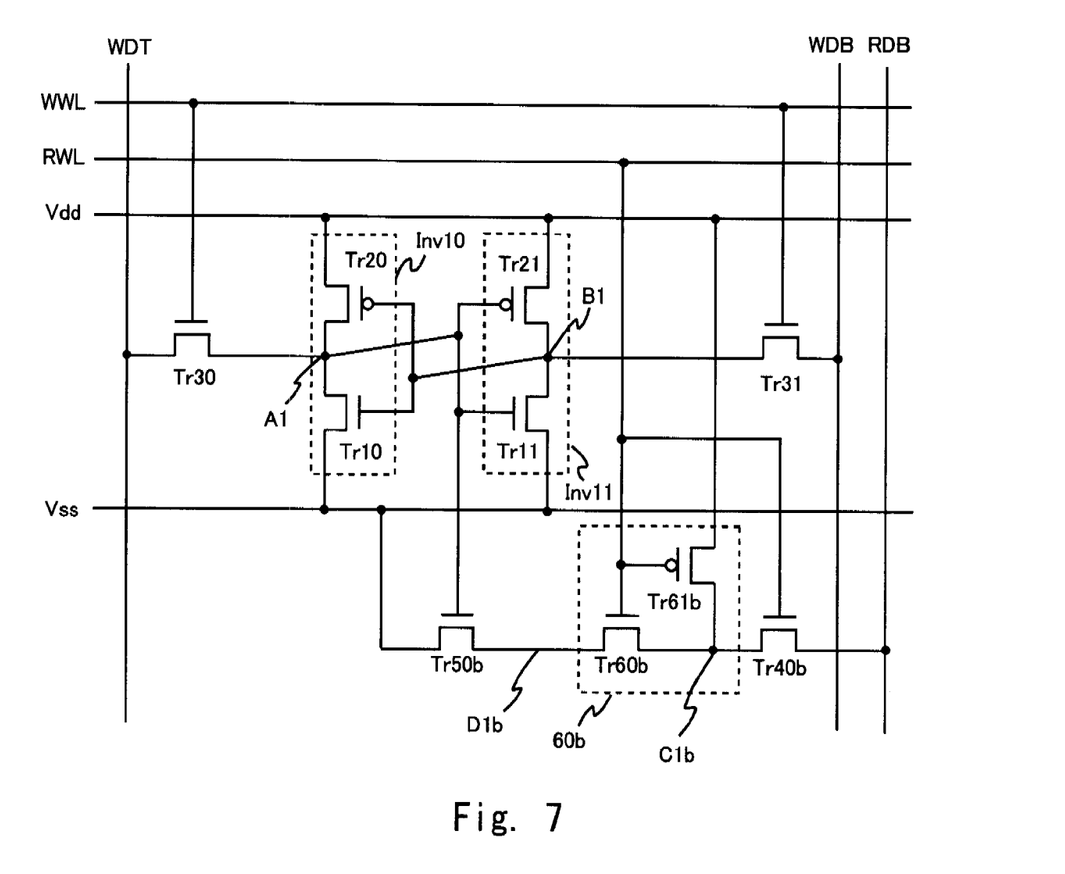
FIG. 7 shows another example of a circuit configuration of the memory cell of the semiconductor storage device according to another embodiment.
Figure 8:
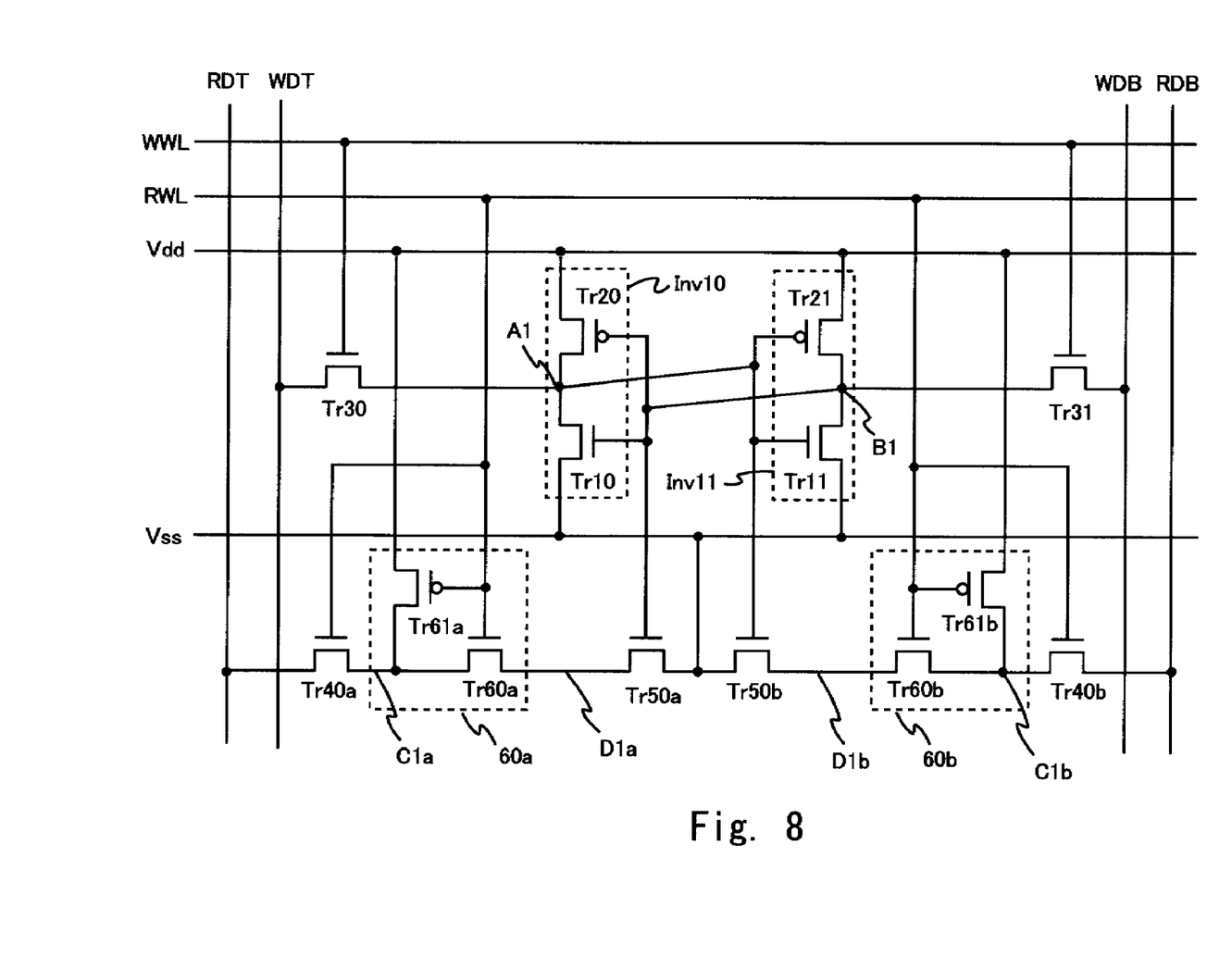
FIG. 8 shows another example of a circuit configuration of the memory cell of the semiconductor storage device according to another embodiment.

Further, as shown in FIG. 7, it is also possible to use the read-only current path formed by the transistors Tr40*b*, Tr50*b*, and the fixed voltage keeping circuit 60*b* in the bit line DB side (RDB, WDB) as in the configuration of the two-port memory cell, as is the same as in FIG. 4. In this case, the gates of the transistors Tr30 and Tr31 are connected to the write-only word line WWL. The gates of the transistors Tr60*b* and Tr61*b* included in the fixed voltage keeping circuit 60*b* and the gate of the transistor Tr40*b* are connected to the read-only word line RWL. Further, one of the source and the drain of the transistor Tr31 is connected to the write-only bit line WDB, and one of the source and the drain of the transistor Tr40*b* is connected to the read-only bit line RDB. Other connection relations are the same as those in FIG. 4. Furthermore, as shown in FIG. 8, in the two-port memory cell configuration, the two read-only current paths having the same connection relation as in FIGS. 6 and 7 may be used in the bit line DT side (RDT, WDT) and the bit line DB side (RDB, WDB). To be more specific, the two read-only current paths are formed by the transistors Tr40*a*, Tr50*a*, the fixed voltage keeping circuit 60*a*, and the transistors Tr40*b*, Tr50*b*, the fixed voltage keeping circuit 60*b*.

It is apparent that the present invention is not limited to the above embodiments, but may be modified and changed without departing from the scope and spirit of the invention.

What is claimed is:

1. A semiconductor storage device, including a plurality of memory cells, each of the plurality of memory cells comprising:
   a first inverter and a second inverter;
   a first node and a second node, the first node being connected to an output of the first inverter and an input of the second inverter, the second node being connected to an output of the second inverter and an input of the first inverter;
   a first transistor and a second transistor, the first transistor having one of a source and a drain connected to the first node, the second transistor having one of a source and a drain connected to the second node;
   a first bit line and a second bit line, the first bit line being connected to the other of the source and the drain of the first transistor, the second bit line being connected to the other of the source and the drain of the second transistor; and
   a word line connected to a gate of the first transistor and a gate of the second transistor, the semiconductor storage device comprising:
   a third transistor having one of a source and a drain connected to the first bit line; and
   a fixed voltage keeping circuit keeping a potential of the other of the source and the drain of the third transistor to a fixed potential in a memory cell non-selected state.

2. A semiconductor storage device, including a plurality of memory cells, each of the plurality of memory cells comprising:
   a first inverter and a second inverter;
   a first node and a second node, the first node being connected to an output of the first inverter and an input of the second inverter, the second node being connected to an output of the second inverter and an input of the first inverter;
   a first transistor and a second transistor, the first transistor having one of a source and a drain connected to the first node, the second transistor having one of a source and a drain connected to the second node;
   a first bit line and a second bit line, the first bit line being connected to the other of the source and the drain of the first transistor, the second bit line being connected to the other of the source and the drain of the second transistor; and a word line connected to a gate of the first transistor and a gate of the second transistor, the semiconductor storage device further comprising:

a third transistor having one of a source and a drain connected to the first bit line and switching supply of a ground voltage performed on the first bit line in accordance with a value held in the memory cell according to selection and non-selection of the memory cell;

a fixed voltage keeping circuit keeping a potential of the other of the source and the drain of the third transistor to a fixed potential in a memory cell non-selected state; and a fourth transistor having one of a source and a drain connected to a ground terminal and supplying the ground voltage to the other of the source and the drain according to the value held in the memory cell, wherein the fixed voltage keeping circuit electrically connects the other of the source and the drain of the fourth transistor and the other of the source and the drain of the third transistor in a memory cell selected state.

3. The semiconductor storage device according to claim 2, wherein the fixed voltage keeping circuit comprises:

a fifth transistor having one of a source and a drain connected to a fixed potential node, the fixed potential node being supplied with the fixed potential, and the other of the source and the drain connected to the other of the source and the drain of the third transistor, the fifth transistor being in a conduction state in the memory cell non-selected state; and a sixth transistor having one of a source and a drain connected to the other of the source and the drain of the third transistor, and the other of the source and the drain connected to the other of the source and the drain of the fourth transistor, the sixth transistor being in a non-conduction state in the memory cell non-selected state.

4. The semiconductor storage device according to claim 1, wherein the fixed potential is the same potential to a precharge voltage when the bit lines are precharged.

5. The semiconductor storage device according to claim 1, wherein the fixed potential is a power supply voltage.

6. A semiconductor storage device, including a plurality of memory cells, each of the plurality of memory cells comprising:

a first inverter and a second inverter;

a first node and a second node, the first node being connected to an output of the first inverter and an input of the second inverter, the second node being connected to an output of the second inverter and an input of the first inverter;

a first transistor and a second transistor, the first transistor having one of a source and a drain connected to the first node, the second transistor having one of a source and a drain connected to the second node;

a first bit line and a second bit line, the first bit line being connected to the other of the source and the drain of the first transistor, the second bit line being connected to the other of the source and the drain of the second transistor; and a word line connected to a gate of the first transistor and a gate of the second transistor, the semiconductor storage device further comprises:

a third transistor having one of a source and a drain connected to the first bit line and switching supply of a ground voltage performed on the first bit line in accordance with a value held in the memory cell according to selection and non-selection of the memory cell; and a fixed voltage keeping circuit keeping a potential of the other of the source and the drain of the third transistor to a fixed potential in a memory cell non-selected state, wherein the first bit line includes a write-only bit line and a read-only bit line, one of the source and the drain of the third transistor being connected to the read-only bit line, and the other of the source and the drain of the first transistor being connected to the write-only bit line.

7. A semiconductor storage device, including a plurality of memory cells, each of the plurality of memory cells comprising:

a first inverter and a second inverter;

a first node and a second node, the first node being connected to an output of the first inverter and an input of the second inverter, the second node being connected to an output of the second inverter and an input of the first inverter;

a first transistor and a second transistor, the first transistor having one of a source and a drain connected to the first node, the second transistor having one of a source and a drain connected to the second node;

a first bit line and a second bit line, the first bit line being connected to the other of the source and the drain of the first transistor, the second bit line being connected to the other of the source and the drain of the second transistor; and a word line connected to a gate of the first transistor and a gate of the second transistor, the semiconductor storage device comprising:

a third transistor having one of a source and a drain connected to a third bit line; and a fixed voltage keeping circuit keeping a potential of the other of the source and the drain of the third transistor to a fixed potential in a memory cell non-selected state.

8. A semiconductor storage device comprising at least one memory cell, wherein the memory cell comprises:

a memory circuit configured to store a bit and including at least a first and a second node;

a first transistor and a second transistor, the first transistor having one of a source and a drain connected to the first node, the second transistor having one of a source and a drain connected to the second node;

a third transistor; and a switching element, wherein:

a first bit line is connected to the other of the source and the drain of the first transistor, a second bit line is connected to the other of the source and the drain of the second transistor, a word line is connected to a gate of the first transistor and a gate of the second transistor, the third transistor having one of a source and a drain connected to the first bit line, and the other of source and drain connected to the switching element, and the switching element is configured to hold the other of the source and drain terminal of the third transistor to a fixed potential during every period in which the memory cell is in a non-selected state.

9. The semiconductor storage device of claim 8, wherein the memory cell is in the non-selected state when the word line is at a ground potential.

10. The semiconductor storage device of claim 8, wherein a gate of the switching element is connected to the word line.

11. The semiconductor storage device of claim 1, wherein the third transistor supplies a ground voltage to the first bit line in accordance with a value held in the memory cell and based on a selection and non-selection of the memory cell by the word line.

12. The semiconductor storage device of claim 7, wherein the third transistor supplies a ground voltage to the third bit line in accordance with a value held in the memory cell and based on a selection and non-selection of the memory cell by the word line.

13. The semiconductor storage device of claim 1, wherein the fixed voltage keeping circuit holds the other of the source and the drain of the third transistor at the fixed potential during every period in which the memory cell is not selected.

14. The semiconductor storage device of claim 7, wherein the fixed voltage keeping circuit holds the other of the source and the drain of the third transistor at the fixed potential during every period in which the memory cell is not selected.

* * * * *